(12) United States Patent
Jin et al.

(10) Patent No.: US 11,075,072 B2
(45) Date of Patent: Jul. 27, 2021

(54) WAFER SCALE ULTRASONIC SENSING DEVICE AND MANUFACTURING METHOD THEREOF

(71) Applicants: J-METRICS TECHNOLOGY Co., Ltd., Taipei (TW); Peking University Shenzhen Graduate School, Shenzhen (CN)

(72) Inventors: Yu-Feng Jin, Shenzhen (CN); Sheng-Lin Ma, Shenzhen (CN); Qian-Cheng Zhao, Shenzhen (CN); Yi-Hsiang Chiu, Taipei (TW); Huan Liu, Shenzhen (CN); Hung-Ping Lee, Taipei (TW); Dan Gong, Shenzhen (CN)

(73) Assignees: J-Metrics Technology Co., Ltd., Taipei (TW); Peking University Shenzhen Graduate School, Shenzhen (CN)

( * ) Notice: Subject to any disclaimer, the term of this patent is extended or adjusted under 35 U.S.C. 154(b) by 0 days.

(21) Appl. No.: 16/874,244

(22) Filed: May 14, 2020

(65) Prior Publication Data
US 2021/0013026 A1    Jan. 14, 2021

(30) Foreign Application Priority Data
Jul. 12, 2019 (TW) .................................. 108124798

(51) Int. Cl.
*H01L 21/02* (2006.01)
*B24B 49/00* (2012.01)
(Continued)

(52) U.S. Cl.
CPC ........ *H01L 21/02013* (2013.01); *B24B 7/228* (2013.01); *B24B 49/003* (2013.01);
(Continued)

(58) Field of Classification Search
None
See application file for complete search history.

(56) References Cited

U.S. PATENT DOCUMENTS 10,656,255 B2 * 5/2020 Ng ........................ H01L 41/047
10,706,835 B2 * 7/2020 Garlepp ............... G10K 11/345
(Continued)

*Primary Examiner* — Alexander G Ghyka
(74) *Attorney, Agent, or Firm* — Muncy, Geissler, Olds & Lowe, P.C.

(57) ABSTRACT

A wafer scale ultrasonic sensing device includes a substrate assembly, an ultrasonic component, a first protective layer, a first conductive circuit, a second conductive circuit, a second protective layer, a conductive material, electrical connection layers, and soldering portions. The substrate assembly includes a first wafer and a second wafer, and the second wafer covers a groove on the first wafer to define a hollow chamber. The first wafer, the second wafer, and the first protective layer are coplanar with the first conductive circuit on a first side surface and coplanar with the second conductive circuit on a second side surface. The second protective layer has an opening, where the conductive material is in the opening and is in contact with the ultrasonic component. The electrical connection layers are on the first side surface and the second side surface, and the soldering portions are respectively connected to the electrical connection layers.

11 Claims, 12 Drawing Sheets

(51) Int. Cl.
  *B24B 49/04* (2006.01)
  *H01L 21/66* (2006.01)
  *H01L 23/00* (2006.01)
  *B24B 7/22* (2006.01)
  *H01L 21/60* (2006.01)

(52) U.S. Cl.
  CPC .............. *B24B 49/04* (2013.01); *H01L 22/12* (2013.01); *H01L 24/94* (2013.01); *H01L 2021/60195* (2013.01)

(56) References Cited

U.S. PATENT DOCUMENTS

| | | | |
|---|---|---|---|
| 2020/0134280 A1* | 4/2020 | Apte | B06B 1/0692 |
| 2020/0164406 A1* | 5/2020 | Jin | H01L 41/31 |
| 2020/0179979 A1* | 6/2020 | Jin | H01L 41/0831 |
| 2020/0191646 A1* | 6/2020 | Jin | H01L 41/277 |

* cited by examiner

WAFER SCALE ULTRASONIC SENSING DEVICE AND MANUFACTURING METHOD THEREOF

CROSS-REFERENCE TO RELATED APPLICATION

This non-provisional application claims priority under 35 U.S.C. § 119(a) to Patent Application No. 108124798 in Taiwan, R.O.C. on Jul. 12, 2019, the entire contents of which are hereby incorporated by reference.

BACKGROUND

Technical Field

This application relates to the field of ultrasonic transmission, and in particular, to a wafer scale ultrasonic sensing device and a manufacturing method thereof.

Related Art

As functions of 3C products become increasingly more convenient, intelligent electronic devices such as smart phones and tablets, or notebook computers have become necessary tools for life and work. Because working data, personal data, even financial data, and the like are stored in such electronic products nowadays, the loss of data can cause huge losses to users. Therefore, in addition to a traditional account number and password, physiological information of a user is usually adopted to authenticate and identify the user, so as to achieve the functions of full anti-counterfeiting and data loss prevention.

Among the physiological information, the most commonly used means is fingerprint identification. The fingerprint identification identifies a fingerprint by sending a super signal to a finger and then receiving the strength of a signal reflected back by a wave crest and a wave trough of the fingerprint. At present, a better effect can be achieved in an ultrasonic mode, and effective identification can be implemented even under a condition of wet fingers. At present, the yield of the current manufacturing process of a wafer scale ultrasonic sensing component is still not high, and this directly affects manufacturing costs and a sale price. To be used as a necessary configuration component of 3C products in the future, the component still needs to be improved greatly.

SUMMARY

Herein, a wafer scale ultrasonic sensing device is provided. The wafer scale ultrasonic sensing device includes a substrate assembly, an ultrasonic component, a first protective layer, a first conductive circuit, a second conductive circuit, a second protective layer, a conductive material, two electrical connection layers and two soldering portions.

The substrate assembly includes a first wafer and a second wafer, where the first wafer is provided with a groove, and the second wafer is bonded with the first wafer and covers the groove to define a hollow chamber. The ultrasonic component is on the second wafer, and projections of the ultrasonic component and the hollow chamber are overlapped in a perpendicular direction. The first protective layer is on a first surface of the second wafer and surrounds the ultrasonic component. The first conductive circuit and the second conductive circuit are on the first protective layer, and are connected to an upper surface of the ultrasonic component, where the first wafer, the second wafer, the first protective layer and the first conductive circuit are coplanar on a first side surface, and the first wafer, the second wafer, the first protective layer and the second conductive circuit are coplanar on a second side surface.

The second protective layer covers the first conductive circuit and the second conductive circuit. The second protective layer has an opening, and the upper surface of the ultrasonic component corresponds to the opening. The conductive material is within the opening and is in contact with the upper surface of the ultrasonic component. The two electrical connection layers are on the first side surface and the second side surface respectively, and are connected to the first conductive circuit and the second conductive circuit. The two soldering portions are on a bottom surface of the first wafer, and are connected to the two electrical connection layers respectively.

In some embodiments, the ultrasonic component includes a first piezoelectric layer, a first electrode, a second piezoelectric layer and a second electrode that are sequentially stacked on the second wafer, where the second piezoelectric layer and the second electrode do not cover a part of an upper surface of the first electrode, the conductive material is in contact with the second electrode, and the first electrode and the second electrode are connected to the first conductive circuit and the second conductive circuit respectively.

In some embodiments, the ultrasonic component includes a first ultrasonic unit and a second ultrasonic unit. The first ultrasonic unit includes a first piezoelectric layer and a first electrode. The first piezoelectric layer is on the second wafer, and the first piezoelectric layer and the first protective layer are provided with a first contact hole for communication. The first electrode is covered in the first piezoelectric layer, and a part of the first electrode is exposed in the first contact hole. A part of the first conductive circuit is in the first contact hole and is connected to the first electrode. The second ultrasonic unit is not overlapped with the first ultrasonic unit in a direction perpendicular to the second wafer, and the second ultrasonic unit includes a second piezoelectric layer, a second circuit pattern layer and a second electrode. The second piezoelectric layer is on the second wafer, and the second piezoelectric layer and the first piezoelectric layer are in a same layer and separated from each other. The second circuit pattern layer is covered in the second piezoelectric, and the second circuit pattern layer and the first electrode are in a same layer and separated from each other. The second electrode is on the second piezoelectric layer. The first protective layer is provided with a second contact hole, and the second contact hole is in communication with the opening. A part of the second conductive circuit is in the second contact hole and is connected to the second electrode, and a part of the conductive material is filled in the second contact hole and is in contact with the second electrode.

In some embodiments, the conductive material is polydimethylsiloxane.

Herein, a manufacturing method of a wafer scale ultrasonic sensing device is further provided. The manufacturing method of a wafer scale ultrasonic sensing device includes: a substrate preparation step, a bonding step, an ultrasonic component forming step, a first protective layer forming step, a circuit connecting step, a second protective layer forming step, an opening forming step, a removing step, an electrical connection layer forming step, a soldering portion forming step and a conductive material filling step.

The substrate preparation step includes providing a first wafer and a composite substrate, where the first wafer is provided with a groove, and the composite substrate includes a second wafer, an insulating layer and a third wafer that are sequentially stacked. The bonding step includes anodic bonding the second wafer with the first wafer, where the second wafer covers the groove, so that the groove forms a hollow chamber. The removing step includes removing the insulating layer and the third wafer on the insulating layer to complete a substrate assembly.

The ultrasonic component forming step includes forming an ultrasonic component on the second wafer, where projections of the ultrasonic component and the hollow chamber are overlapped in a perpendicular direction, and the ultrasonic component includes a first electrode and a second electrode that is not connected to the first electrode. The first protective layer forming step includes forming a first protective layer on an upper surface of the ultrasonic component and a first surface of the second wafer, where the first protective layer is provided with a first contact hole and a second contact hole, and a part of the first electrode and a part of the second electrode are exposed in the first contact hole and the second contact hole respectively.

The circuit connecting step includes forming a first conductive circuit and a second conductive circuit on the first protective layer. A part of the first conductive circuit and a part of the second conductive circuit are in the first contact hole and the second contact hole respectively, and are connected to the first electrode and the second electrode of the ultrasonic component respectively. The second protective layer forming step includes forming a second protective layer to cover the first conductive circuit and the second conductive circuit. The opening forming step includes forming an opening on the second protective layer, where at least a part of the second electrode is exposed in the opening.

The removing step includes removing a part of the substrate assembly, a part of the first protective layer, a part of the first conductive circuit, and a part of the second conductive circuit to form a first side surface on which the first wafer, the second wafer, the first protective layer and the first conductive circuit are coplanar, and a second side surface on which the first wafer, the second wafer, the first protective layer and the second conductive circuit are coplanar. The electrical connection layer forming step includes forming electrical connection layers on the first side surface and the second side surface respectively, where the electrical connection layers are connected to the first conductive circuit and the second conductive circuit respectively. The soldering portion forming step includes forming two soldering portions on a surface of the first wafer, where the soldering portions are connected to the electrical connection layers respectively. The conductive material filling step includes filling a conductive material in the opening, where the conductive material is in contact with the upper surface of the ultrasonic component.

In some embodiments, a grinding step is further included before the bonding step, and a thickness of the second wafer is reduced in the grinding step.

In some embodiments, a carrier plate covering step is further included after the opening forming step, and the carrier plate covering step includes covering a carrier plate on the second protective layer and the opening to shield the opening. A carrier plate removing step is further included after the soldering portion forming step to remove the carrier plate to expose the opening.

In some embodiments, the ultrasonic component forming step includes: sequentially forming a first piezoelectric layer, a first electrode, a second piezoelectric layer and a second electrode on the second wafer; and removing a part of the second piezoelectric layer and a part of the second electrode, so that the second piezoelectric layer and the second electrode do not cover a part of an upper surface of the first electrode, and in the opening forming step, the first protective layer above the second electrode is further removed.

In some embodiments, the ultrasonic component forming step includes: sequentially forming a first piezoelectric material layer and a first electrode material layer on the second wafer; patterning the first piezoelectric material layer and the first electrode material layer to form a first bottom piezoelectric layer and a second bottom piezoelectric layer that are separated from each other, and stacking a first electrode and a second circuit pattern layer on the first bottom piezoelectric layer and the second bottom piezoelectric layer respectively; sequentially forming a second piezoelectric material layer and a second electrode material layer on the first electrode and the second circuit pattern layer; and patterning the second piezoelectric material layer and the second electrode material layer to form a first piezoelectric layer and a second piezoelectric layer that are separated from each other, and a second electrode formed on the second piezoelectric layer, where the first electrode is covered in the first piezoelectric layer, and the second circuit pattern layer is covered in the second piezoelectric layer.

More specifically, in some embodiments, a first protective material layer is formed on the first piezoelectric layer, the second piezoelectric layer and the second electrode; and the first protective material layer is punched to pattern the first protective material layer into the first protective layer, where the first protective layer is provided with the first contact hole and the second contact hole, the first contact hole penetrates the first protective layer and the first piezoelectric layer so that a part of the first electrode is exposed in the first contact hole, and the second contact hole penetrates the first protective layer so that a part of the second electrode is exposed in the second contact hole.

In some embodiments, the bonding step is performed in a vacuum environment.

Based on foregoing, due to a medium difference between the hollow chamber and a conductive material in application, the wafer scale ultrasonic sensing device allows ultrasonic signals transmitted therein to have different speeds, so that the signals can be effectively distinguished. In addition, the stability of alignment and bonding can be effectively improved through the configuration and the manufacturing method of the substrate assembly, and the overall manufacturing yield can be effectively improved, thereby further reducing overall costs.

DETAILED DESCRIPTION

Figure 1:
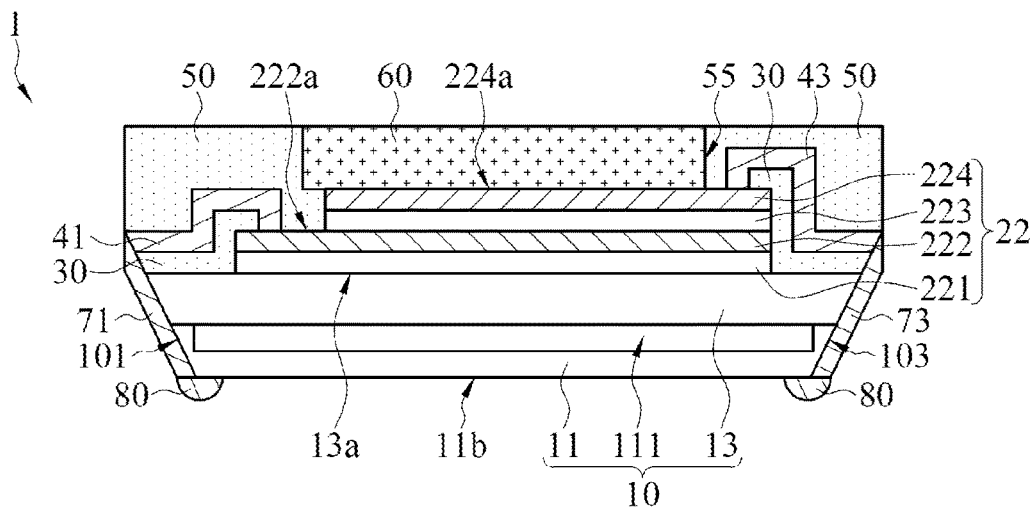
FIG. 1 is a schematic cross-sectional view of a first embodiment of a wafer scale ultrasonic sensing device.

FIG. 1 is a schematic cross-sectional view of a first embodiment of a wafer scale ultrasonic sensing device. As shown in FIG. 1, the wafer scale ultrasonic sensing device 1 of the first embodiment includes a substrate assembly 10, an ultrasonic component 22, a first protective layer 30, a first conductive circuit 41, a second conductive circuit 43, a second protective layer 50, a conductive material 60, a first electrical connection layer 71, a second electrical connection layer 73 and two soldering portions 80. The substrate assembly 10 is a composite substrate, and includes a first wafer 11 and a second wafer 13, where the first wafer 11 is provided with a groove 111, and the second wafer 13 is bonded with the first wafer 11 by means of anodizing and covers the groove 111 to define a hollow chamber 111. It is explained herein that the groove 111 and the hollow chamber 111 are substantially a same space, and therefore adopt a same component number.

The ultrasonic component 22 is on the second wafer 13, and more specifically, is on a first surface 13a of the second wafer. Projections of the ultrasonic component 22 and the hollow chamber 111 are overlapped in a perpendicular direction. That is, the projections of the ultrasonic component 22 and the hollow chamber 111 are at least partially overlapped on a virtual plane.

The first protective layer 30 is on the first surface 13a of the second wafer 13 and surrounds the ultrasonic component 22. The first conductive circuit 41 and the second conductive circuit 43 are on the first protective layer 30, and are connected to upper surfaces 222a and 224a of the ultrasonic component 22 respectively. More specifically, the first conductive circuit 41 is connected to the upper surface 222a of a first electrode 222 of the ultrasonic component 22, and the second conductive circuit 43 is connected to the upper surface 224a of a second electrode 224 of the ultrasonic component 22. The first wafer 11, the second wafer 13, the first protective layer 30 and the first conductive circuit 41 are coplanar on a first side surface 101. The first wafer 11, the second wafer 13, the first protective layer 30 and the second conductive circuit 43 are coplanar on a second side surface 103. More specifically, the first side surface 101 and the second side surface 103 are two inclined surfaces of the wafer scale ultrasonic sensing device 1. The width of the inclined surfaces is gradually reduced from the first conductive circuit 41 and the second conductive circuit 43 towards the first wafer 11.

The second protective layer 50 covers the first conductive circuit 41 and the second conductive circuit 43. The second protective layer 50 is provided with an opening 55, and the upper surface 224a of the ultrasonic component 22 corresponds to the opening 55. The conductive material 60 is in the opening 55 and is in contact with the upper surface 224a of the ultrasonic component 22. The first electrical connection layer 71 and the second electrical connection layer 73 are on the first side surface 101 and the second side surface 103 respectively, and are connected to the first conductive circuit 41 and the second conductive circuit 43 respectively. The two soldering portions 80 are on a bottom surface 11b of the first wafer 11, and are respectively connected to the first electrical connection layer 71 and the second electrical connection layer 73. The soldering portions 80 may be soldered to a circuit board or a specific chip to provide an electric loop for controlling the wafer scale ultrasonic sensing device 1.

In the first embodiment, the ultrasonic component 22 includes a first piezoelectric layer 221, a first electrode 222, a second piezoelectric layer 223 and a second electrode 224 that are sequentially stacked on the second wafer 13, where the second piezoelectric layer 223 and the second electrode 224 do not cover a part of the upper surface 222a of the first electrode 222. The conductive material 60 is in contact with the upper surface 224a of the second electrode 224, and the first electrode 222 and the second electrode 224 are connected to the first conductive circuit 41 and the second conductive circuit 43 respectively.

More specifically, an objective of the conductive material 60 being in the opening 55 and in contact with the upper surface 224a of the second electrode 224 is to allow ultrasonic signals generated by the ultrasonic component 22 to be better transmitted to a finger through the conductive material 60. In an embodiment, the conductive material 60 may be polydimethylsiloxane (PDMS). However, this is only an example, but is not intended for limitation.

Figure 2:
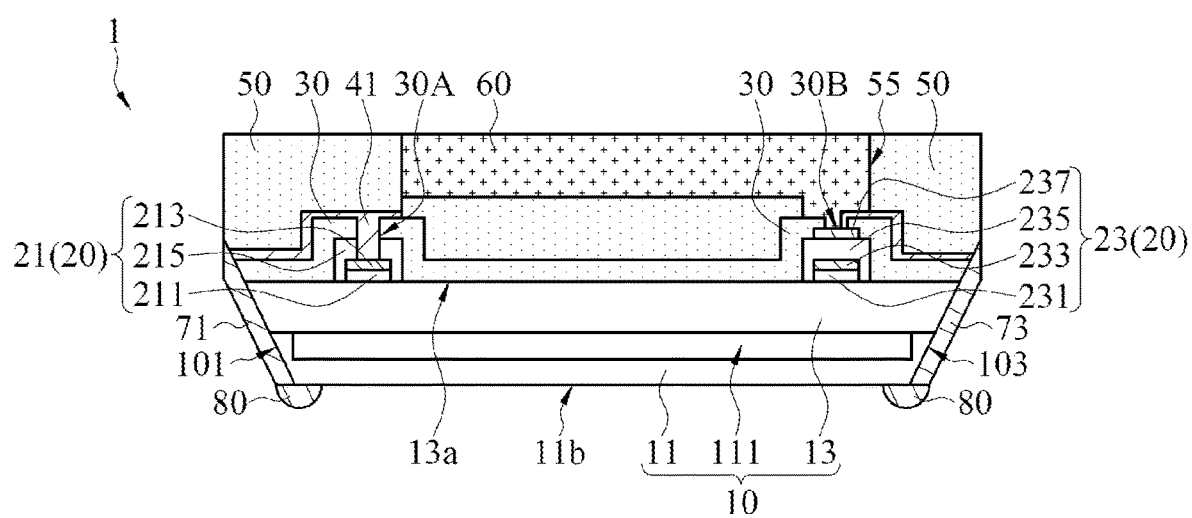
FIG. 2 is a schematic cross-sectional view of a second embodiment of a wafer scale ultrasonic sensing device.

FIG. 2 is a schematic cross-sectional view of a second embodiment of a wafer scale ultrasonic sensing device. As shown in FIG. 2, and referring to FIG. 1, a main difference between the second embodiment and the first embodiment is ultrasonic components. An ultrasonic assembly 20 of the second embodiment includes a first ultrasonic unit 21 and a second ultrasonic unit 23. The first ultrasonic unit 21 includes a first piezoelectric layer 215 and a first electrode 213. The first piezoelectric layer 215 is on the second wafer 13, and the first piezoelectric layer 215 and the first protective layer 30 are provided with a first contact hole 30A for communication. The first electrode 213 is covered in the first piezoelectric layer 215, and a part of the first electrode 213 is exposed in the first contact hole 30A. A part of the first conductive circuit 41 is in the first contact hole 30A and is connected to the first electrode 213. More specifically, the first ultrasonic unit 21 further includes a first bottom piezoelectric layer 211. The first bottom piezoelectric layer 211 is on the second wafer 13, the first electrode 213 is stacked on the first bottom piezoelectric layer 211, and the first bottom piezoelectric layer 211 and the first electrode 213 are covered in the first piezoelectric layer 215 together.

The second ultrasonic unit 23 is not overlapped with the first ultrasonic unit 21 in a direction perpendicular to the second wafer 13. The second ultrasonic unit 23 includes a second piezoelectric layer 235, a second circuit pattern layer 233 and a second electrode 237. The second piezoelectric layer 235 is on the second wafer 13. The second piezoelectric layer 235 and the first piezoelectric layer 215 are in a same layer and separated from each other. The second circuit pattern layer 233 is covered in the second piezoelectric 235. The second circuit pattern layer 233 and the first electrode 213 are in a same layer and separated from each other. The second electrode 237 is on the second piezoelectric layer 235. The first protective layer 30 is provided with a second contact hole 30B, and the second contact hole 30B is in communication with the opening 55. A part of the second conductive circuit 43 is in the second contact hole 30B and is connected to the second electrode 237. A part of the conductive material 60 is filled in the second contact hole 30B and is in contact with the second electrode 237. More specifically, the second ultrasonic unit 23 further includes a second bottom piezoelectric layer 231. The second bottom piezoelectric layer 231 is on the second wafer 13. The second electrode 237 is stacked on the second bottom piezoelectric layer 231. The second bottom piezoelectric layer 231 and the second electrode 237 are covered in the second piezoelectric layer 235 together.

Herein, piezoelectric materials such as aluminum nitride (AlN), zinc oxide (ZnO), and lead zirconate titanate (PZT) may be used for the first bottom piezoelectric layer 211, the second bottom piezoelectric layer 233, the first piezoelectric layer 215/221 and the second piezoelectric layer 235/223 in the first embodiment and the second embodiment. The material of the first protective layer 30 and the second protective layer 50 may be silicon dioxide ($SiO_2$). In addition, the materials of the first electrode 213/222, the second circuit pattern layer 233 and the second electrode 237 may be conductive materials such as aluminum (Al), tungsten (W), molybdenum (Mo), platinum (Pt), gold (Au), silver (Ag), and Copper (Cu). However, this is only an example, but is not intended for limitation.

Figure 3A:
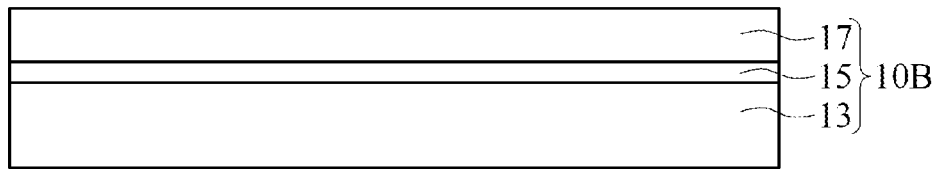
FIG. 3A to FIG. 3O are schematic cross-sectional views corresponding to steps of a manufacturing method of the wafer scale ultrasonic sensing device in the first embodiment.
Figure 3B:
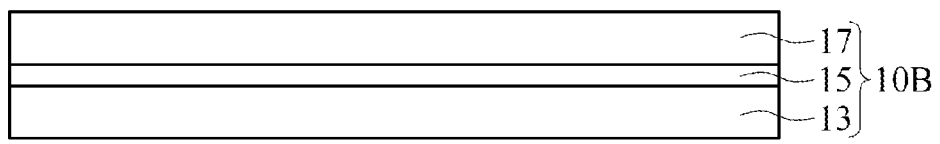
Figure 3C:
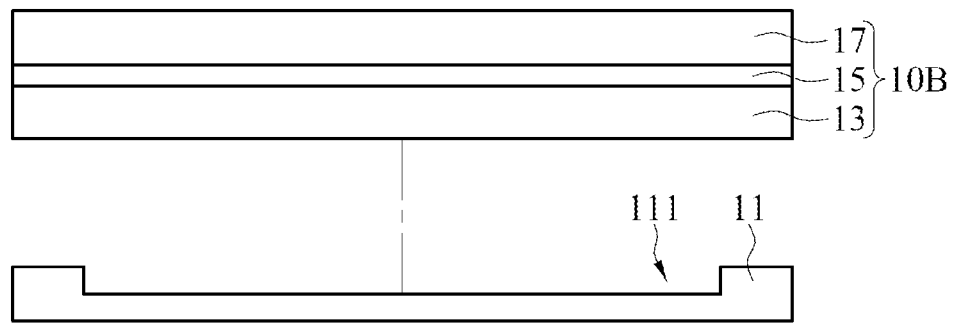
Figure 3D:
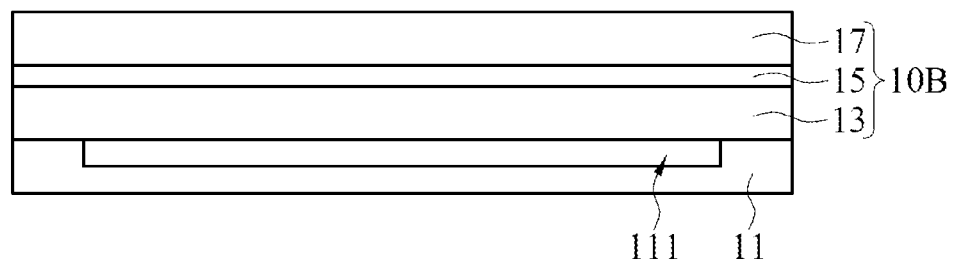
Figure 3E:
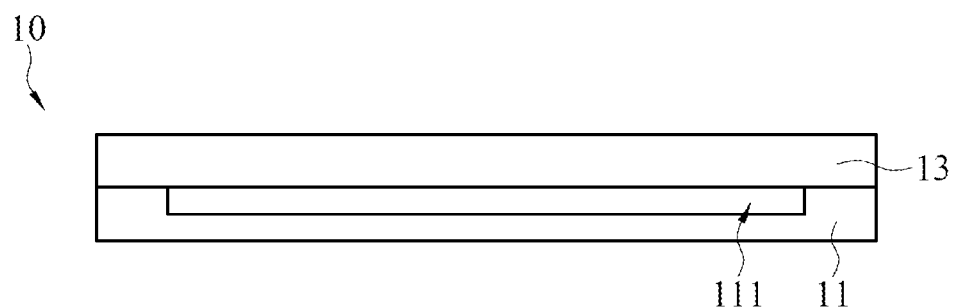
Figure 3F:
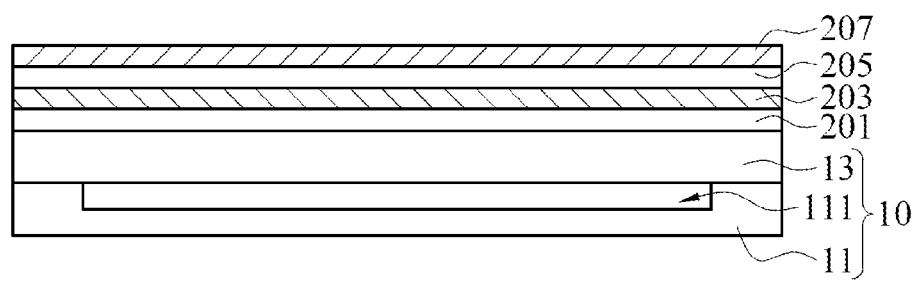
Figure 3G:
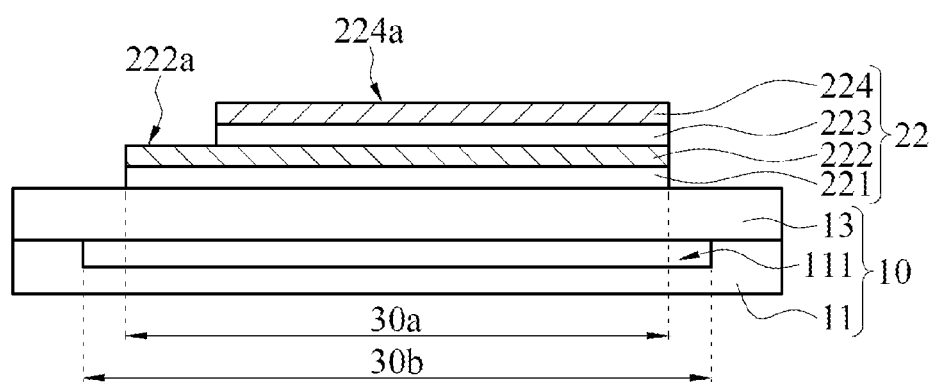
Figure 3H:
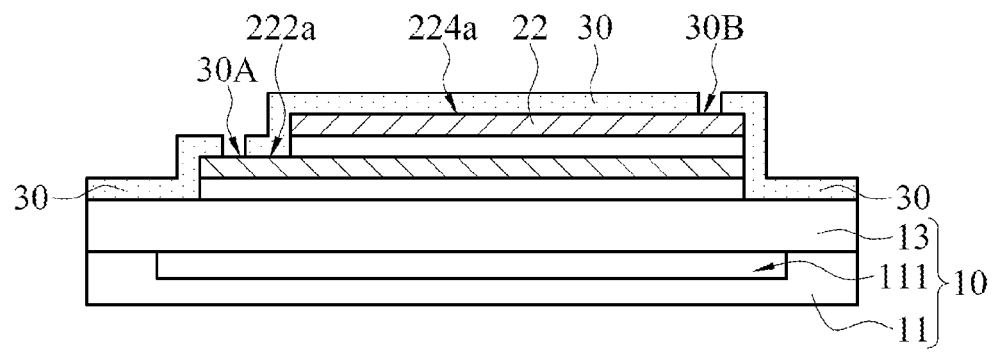
Figure 3I:
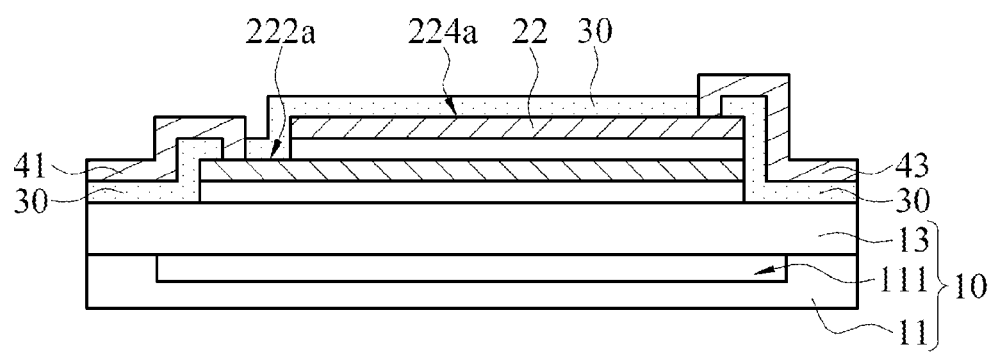
Figure 3J:
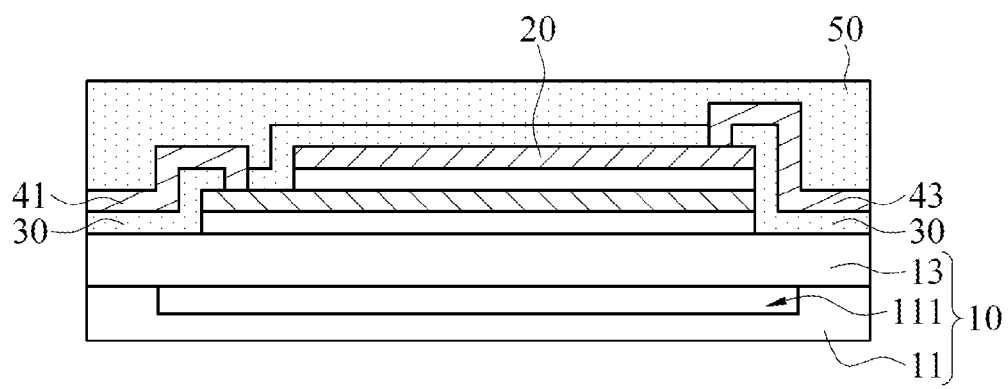
Figure 3K:
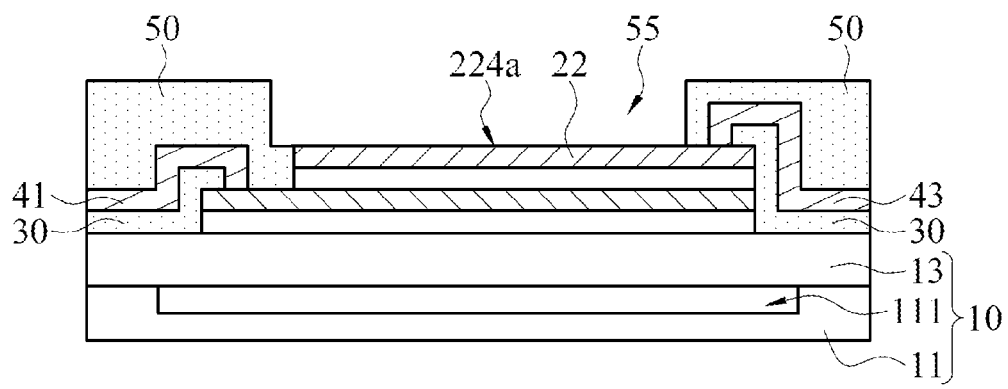
Figure 3L:
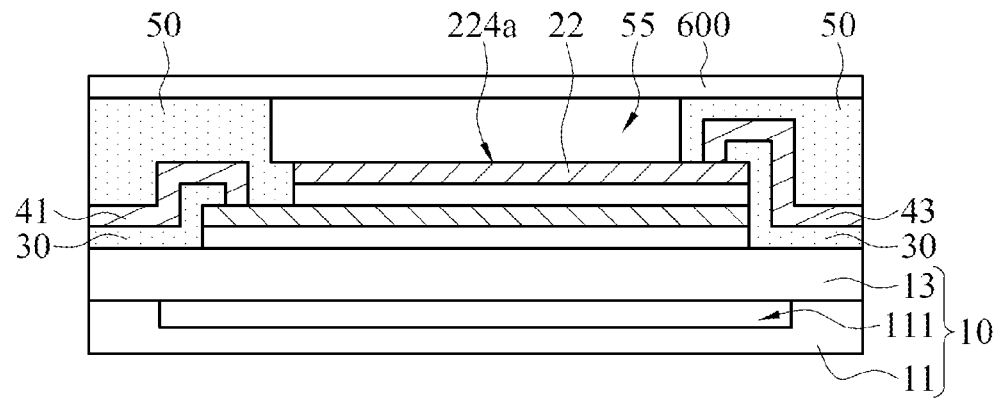
Figure 3M:
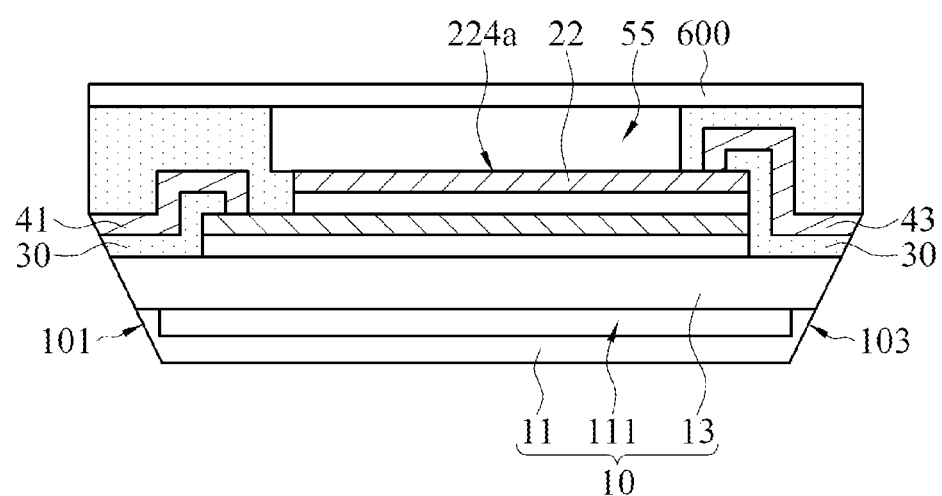
Figure 3N:
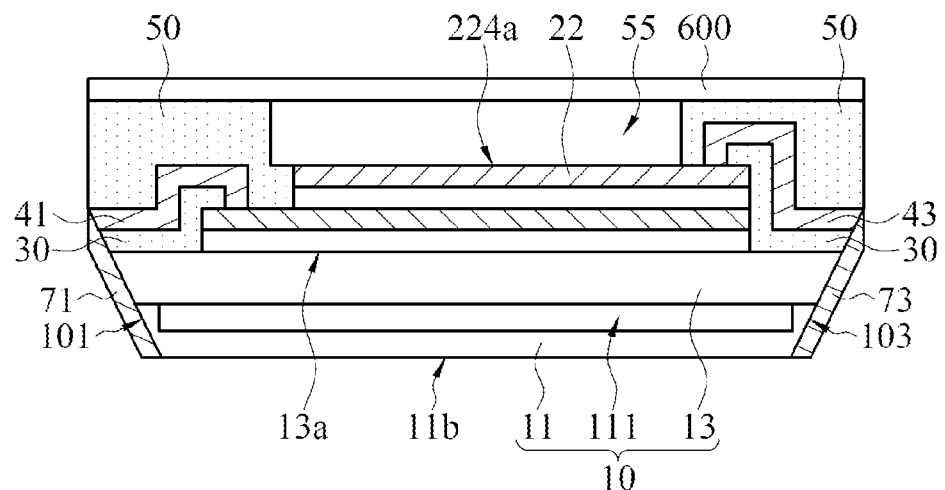
Figure 3O:
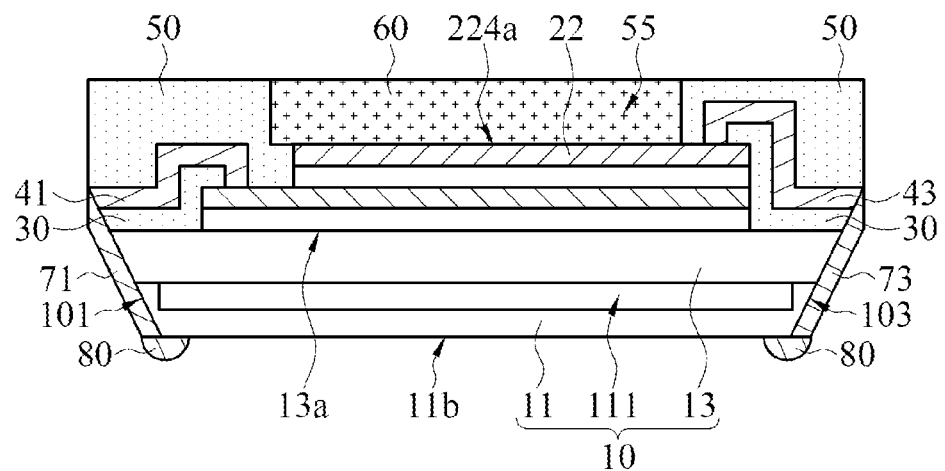

FIG. 3A to FIG. 3O are schematic cross-sectional views corresponding to steps of a manufacturing method of the wafer scale ultrasonic sensing device in the first embodiment. The manufacturing method of the wafer scale ultrasonic sensing device includes: a substrate preparation step, a bonding step, an ultrasonic component forming step, a first protective layer forming step, a circuit connecting step, a second protective layer forming step, an opening forming step, a removing step, an electrical connection layer forming step, a soldering portion forming step and a conductive material filling step. The manufacturing method of the wafer scale ultrasonic sensing device 1 of the first embodiment is described below with reference to the figures.

As shown in FIG. 3A and FIG. 3C, the substrate preparation step includes providing a first wafer 11 and a composite substrate 10B, where the first wafer 11 is provided with a groove 111, and the composite substrate 10B includes a second wafer 13, an insulating layer 15 and a third wafer 17 that are sequentially stacked. Herein, the composite substrate 10B may be a double-layered silicon on insulator (SOI) substrate.

As shown in FIG. 3D, the bonding step includes anodic bonding the second wafer 13 with the first wafer 11, where the second wafer 13 covers the groove 111 to form a hollow chamber 111. In some embodiments, the bonding step is performed in a vacuum environment, so that hollow chamber 111 is in a vacuum state. Considering the thickness of a product, further, after the substrate preparation step and before the bonding step, a grinding step is further included. The grinding step is performed to reduce the thickness of the second wafer 13. The grinding step may be implemented by chemical mechanical polishing (CMP) to reduce the thickness. However, this is only an example, but is not intended for limitation. As shown in FIG. 3E, the removing step includes removing the insulating layer 15 and the third wafer 17 on the insulating layer to complete a substrate assembly 10. Herein, for example, when the insulation layer 15 is silicon dioxide, the insulation layer 15 may be removed by etching with hydrofluoric acid (HF) pickling, and the third wafer 17 may be also removed at the same time.

Referring to FIG. 3F and FIG. 3G, and referring to FIG. 1, the ultrasonic component forming step in the first embodiment includes forming an ultrasonic component 22 on the second wafer 13, where projections of the ultrasonic component 22 and the hollow chamber are overlapped in a perpendicular direction, and the ultrasonic component 22 includes a first electrode 222 and a second electrode 224 that is not connected to the first electrode 222.

More specifically, in the first embodiment, the first piezoelectric layer 221, the first electrode 222, the second piezoelectric layer 223 and the second electrode 224 are sequentially formed on the second wafer 13 first. A part of the second piezoelectric layer 223 and a part of the second electrode 224 are then removed, so that the second piezoelectric layer 223 and the second electrode 224 do not cover a part of an upper surface 222a of the first electrode 222. In some embodiments, when the second piezoelectric layer 223 and the second electrode 224 are removed, a part of the first bottom piezoelectric layer 221 and a part of the first electrode 222 may also be removed.

As shown in FIG. 3H, the first protective layer forming step includes forming a first protective layer 30 on upper surfaces 222a and 224a of the ultrasonic component 22 and a first surface 13a of the second wafer 13. The first protective layer 30 is provided with a first contact hole 30A and a second contact hole 30B. A part of the first electrode 222 and a part of the second electrode 224 are exposed in the first contact hole 30A and the second contact hole 30B respectively. In the first protective layer forming step, the first protective layer 30 may be formed by first coating a protective layer material, and then performing drilling or laser opening.

As shown in FIG. 3I, the circuit connecting step includes forming a first conductive circuit 41 and a second conductive circuit 43 on the first protective layer 30. A part of the first conductive circuit 41 and a part of the second conductive circuit 43 are in the first contact hole 30A and the second contact hole 30B respectively, and are connected to the first electrode 222 and the second electrode 224 of the ultrasonic component 22 respectively. As shown in FIG. 3J, the second protective layer forming step includes forming a second protective layer 50 to cover the first conductive circuit 41 and the second conductive circuit 43. In some embodiments, the second protective layer 50 and the first protective layer 30 may be of a same material.

As shown in FIG. 3K, the opening forming step includes forming an opening 55 on the second protective layer 50, where at least a part of the second electrode 224 is exposed in the opening 55. More specifically, in the opening forming step, the opening further removes the first protective layer 30 above the second electrode 224, so that the upper surface 224a of the second electrode 224 is exposed.

As shown in FIG. 3M, the removing step includes removing a part of the substrate assembly 10, a part of the first protective layer 30, a part of the first conductive circuit 41, and a part of the second conductive circuit 43 to form a first side surface 101 on which the first wafer 11, the second wafer 13, the first protective layer 30 and the first conductive circuit 41 are coplanar, and a second side surface 103 on which the first wafer 11, the second wafer 13, the first protective layer 30 and the second conductive circuit 43 are coplanar. Herein, the first side surface 101 and the second side surface 103 are inclined surfaces of the wafer scale ultrasonic sensing device 1. The width of the inclined surfaces is gradually reduced from the first conductive circuit 41 and the second conductive circuit 43 towards the first wafer 11.

In some embodiments, to ensure the mechanical strength during removing, before the removing step, as shown in FIG. 3L, a carrier plate covering step may be further included after the opening forming step. The carrier plate covering step includes covering a carrier plate 600 on the second protective layer 50 to shield the opening 55.

As shown in FIG. 3N, the electrical connection layer forming step includes forming a first electrical connection layer 71 and a second electrical connection layer 73 on the first side surface 101 and the second side surface 103 respectively. The first electrical connection layer 71 and the second electrical connection layer 73 are connected to the first conductive circuit 41 and the second conductive circuit 43 respectively. Finally, as shown in FIG. 3O, in the soldering portion forming step, two soldering portions 80 are formed on a bottom surface 11b of the first wafer 11, where the soldering portions 80 are connected to the first electrical connection layer 71 and the second electrical connection layer 73 respectively. The conductive material filling step includes filling a conductive material 60 in the opening 55, where the conductive material 60 is in contact with the upper surface 224a of the ultrasonic component 22. More specifically, the conductive material is in contact with the upper surface 224a of the second electrode 224. In an embodiment with the carrier plate 600 for covering, a carrier plate removing step is further included after the soldering portion forming step, to remove the carrier plate 600 to expose the opening 55.

FIG. 4A to FIG. 4H are schematic cross-sectional views corresponding to steps, which are different from the steps in the first embodiment, of a manufacturing method of the wafer scale ultrasonic sensing device in the second embodiment. A main difference between the second embodiment and the first embodiment is the ultrasonic component 22. In the second embodiment, the substrate preparation step and the bonding step before the ultrasonic component forming step are similar to the steps shown in FIG. 3A to FIG. 3E in the first embodiment; the removing step, the electrical connection layer forming step, the soldering portion forming step and the conductive material filling step are also similar to the steps shown in FIG. 3M to FIG. 3O. Details are not described herein again, and only the difference from the first embodiment is described.

Figure 4A:
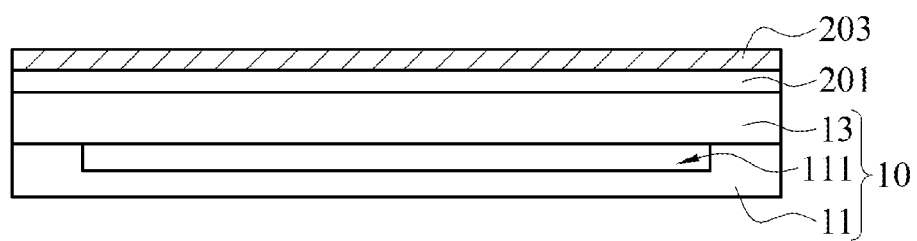
FIG. 4A to FIG. 4H are schematic cross-sectional views corresponding to steps, which are different from the steps in the first embodiment, of a manufacturing method of the wafer scale ultrasonic sensing device in the second embodiment.
Figure 4B:
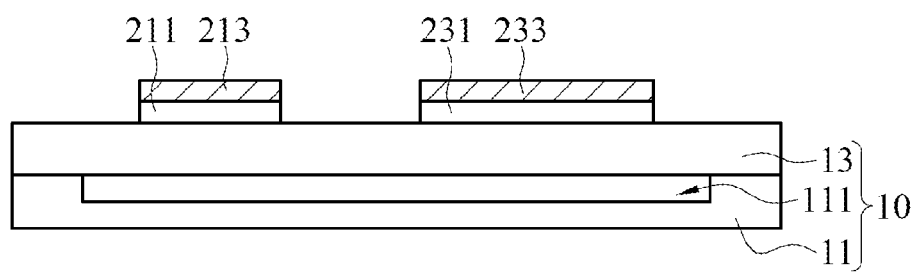

As shown in FIG. 4A, the ultrasonic component forming step of the second embodiment includes: sequentially forming a first piezoelectric material layer 201 and a first electrode material layer 203 on the second wafer 13. Then, as shown in FIG. 4B, the first piezoelectric material layer 201 and the first electrode material layer 203 are patterned to form a first bottom piezoelectric layer 211 and a second bottom piezoelectric layer 231 that are separated from each other, and a first electrode 213 and a second circuit pattern layer 233 that are stacked on the first bottom piezoelectric layer 211 and the second bottom piezoelectric layer 231 respectively.

Figure 4C:
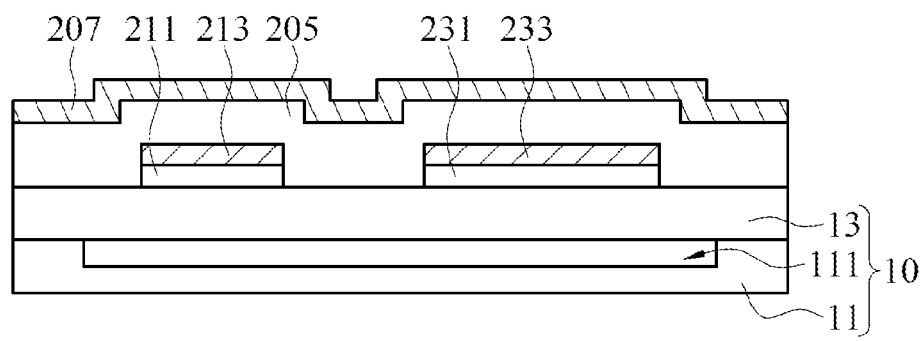

As shown in FIG. 4C, a second piezoelectric material layer 205 and a second electrode material layer 207 are sequentially formed on the first electrode 213 and the second circuit pattern layer 233. In this case, the second piezoelectric material layer 205 and the second electrode material layer 207 cover the first bottom piezoelectric layer 211, the second bottom piezoelectric layer 231, the first electrode 213 and the second circuit pattern layer 233.

Figure 4D:
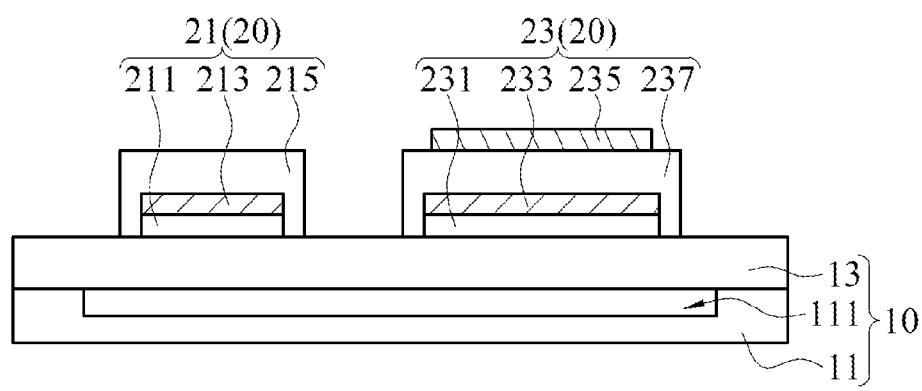

Then, as shown in FIG. 4D, the second piezoelectric material layer 205 and the second electrode material layer 207 are patterned to form a first piezoelectric layer 215 and a second piezoelectric layer 235 that are separated from each other, and a second electrode 237 formed on the second piezoelectric layer 235. In this case, the first electrode 213 is covered in the first piezoelectric layer 215, and the second circuit pattern layer 233 is covered in the second circuit pattern layer 235. In this way, a first ultrasonic unit 21 and a second ultrasonic unit 23 are formed.

Figure 4E:
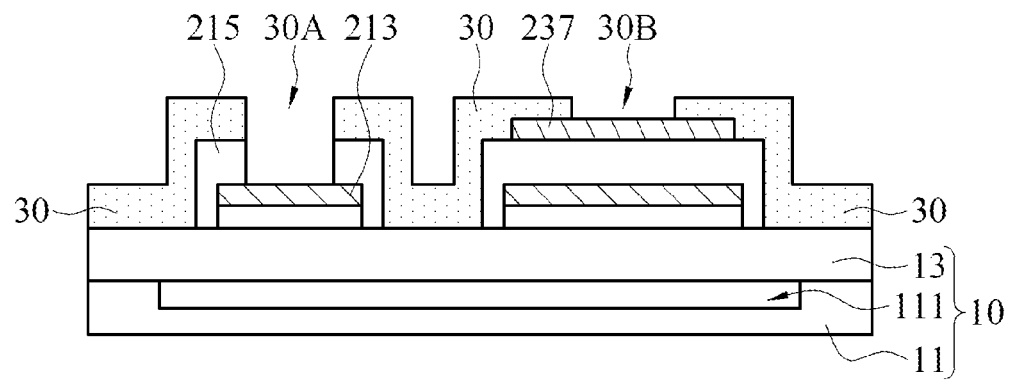

Then, as shown in FIG. 4E, the first protective layer forming step in the second embodiment is the same as that in the first embodiment. A protective material layer is formed on the first piezoelectric layer 215, the second piezoelectric layer 235 and the second electrode 237. The first protective material layer is punched to pattern the first protective material layer into the first protective layer 30. The first protective layer 30 includes a first contact hole 30A and a second contact hole 30B. The first contact hole 30A penetrates the first protective layer 30 and further penetrates the first piezoelectric layer 231 so that a part of the first electrode 213 is exposed in the first contact hole 30A, and the second contact hole 30B penetrates the first protective layer 30 so that a part of the second electrode 237 is exposed in the second contact hole 30B.

Figure 4F:
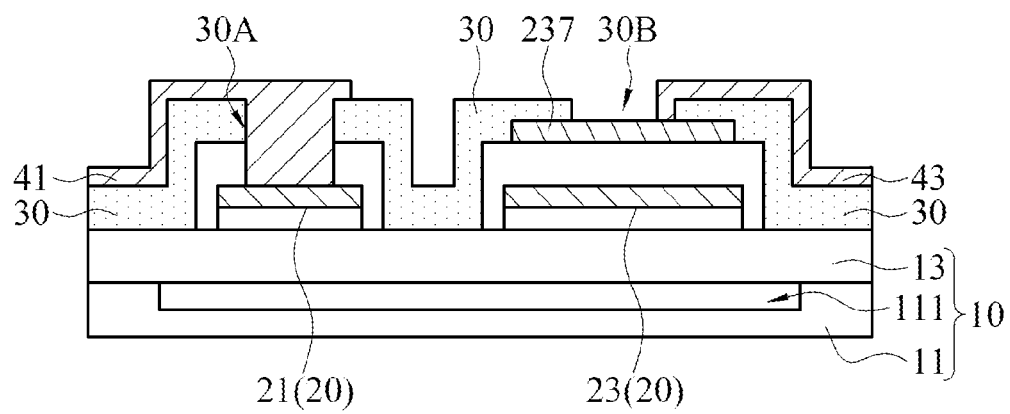

Then, as shown in FIG. 4F, similar to the first embodiment, the circuit connecting step includes forming a first conductive circuit 41 and a second conductive circuit 43 on the first protective layer 30. A part of the first conductive circuit 41 and a part of the second conductive circuit 43 are in the first contact hole 30A and the second contact hole 30B respectively, and are connected to the first electrode 213 and the second electrode 237 of the ultrasonic component 20 respectively.

Figure 4G:
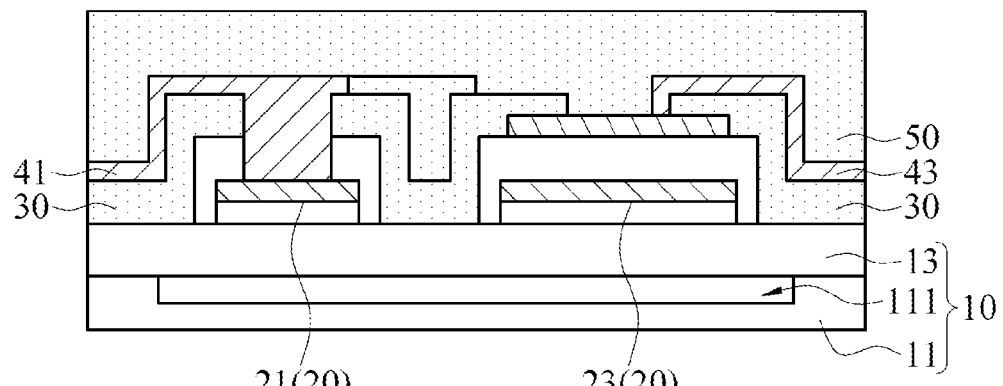
Figure 4H:
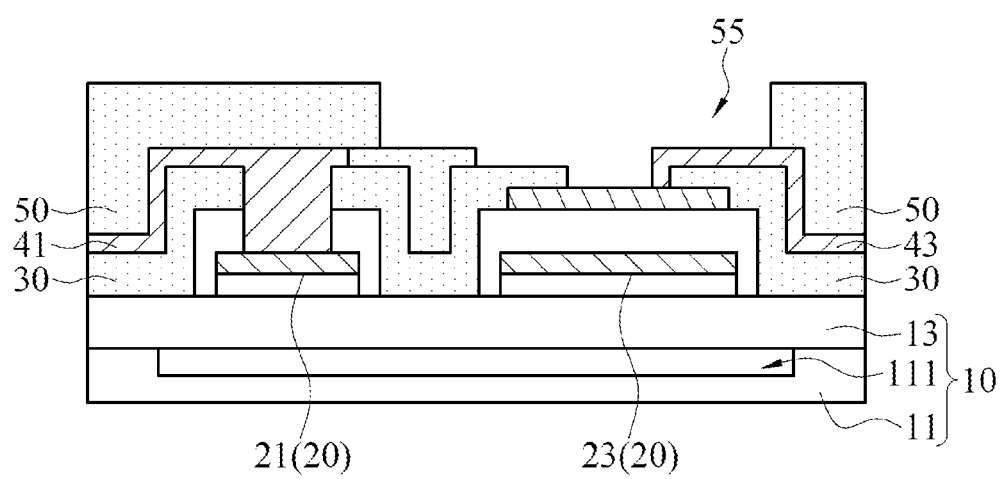

As shown in FIG. 4G, the second protective layer forming step includes forming a second protective layer 50 to cover the first conductive circuit 41, the second conductive circuit 43, and the second electrode 237 that is not connected to the second conductive circuit 43. Finally, as shown in FIG. 4H, the opening forming step includes providing an opening 55 on the second protective layer 50, where at least a part of the second electrode 224 is exposed in the opening 55. More specifically, the opening 55 further exposes the first conductive circuit 41 and the second conductive circuit 43. After that, referring to FIG. 3M to FIG. 3O, the removing step, the electrical connection layer forming step, the soldering portion forming step, and the conductive material filling step are continued, to complete the wafer scale ultrasonic sensing device 1 of the second embodiment as shown in FIG. 2.

According to the foregoing embodiments, due to a medium difference between the hollow chamber 111 and the conductive material 60 in application, the wafer scale ultrasonic sensing device 1 allows ultrasonic signals transmitted therein to have different steps, so that the ultrasonic signals can be effectively distinguished. In addition, the stability of alignment and bonding can be effectively improved through the configuration and the manufacturing method of the substrate assembly 10, and the overall manufacturing yield can be effectively improved, thereby further reducing overall costs.

What is claimed is:
1. A wafer scale ultrasonic sensing device, comprising:
a substrate assembly, comprising a first wafer and a second wafer, wherein the first wafer is provided with a groove, and the second wafer is bonded with the first wafer and covers the groove to define a hollow chamber;
an ultrasonic component on the second wafer, wherein projections of the ultrasonic component and the hollow chamber are overlapped in a perpendicular direction;
a first protective layer on a first surface of the second wafer and surrounding the ultrasonic component;
a first conductive circuit and a second conductive circuit on the first protective layer, and connected to an upper surface of the ultrasonic component, wherein the first wafer, the second wafer, the first protective layer and the first conductive circuit are coplanar on a first side surface, and the first wafer, the second wafer, the first protective layer and the second conductive circuit are coplanar on a second side surface;
a second protective layer covering the first conductive circuit and the second conductive circuit, wherein the second protective layer has an opening, and the upper surface of the ultrasonic component corresponds to the opening;
a conductive material within the opening and in contact with the upper surface of the ultrasonic component;

two electrical connection layers on the first side surface and the second side surface respectively, and connected to the first conductive circuit and the second conductive circuit; and two soldering portions on a bottom surface of the first wafer, and connected to the two electrical connection layers respectively.

2. The wafer scale ultrasonic sensing device according to claim 1, wherein the ultrasonic component comprises a first piezoelectric layer, a first electrode, a second piezoelectric layer and a second electrode that are sequentially stacked on the second wafer, the second piezoelectric layer and the second electrode do not cover a part of an upper surface of the first electrode, the conductive material is in contact with the second electrode, and the first electrode and the second electrode are respectively connected to the first conductive circuit and the second conductive circuit.

3. The wafer scale ultrasonic sensing device according to claim 1, wherein the ultrasonic component comprises a first ultrasonic unit and a second ultrasonic unit, the first ultrasonic unit comprises a first piezoelectric layer and a first electrode, the first piezoelectric layer is on the second wafer, the first piezoelectric layer and the first protective layer are provided with a first contact hole for communication, the first electrode is covered in the first piezoelectric layer, a part of the first electrode is exposed in the first contact hole, and a part of the first conductive circuit is in the first contact hole and is connected to the first electrode; the second ultrasonic unit is not overlapped with the first ultrasonic unit in a direction perpendicular to the second wafer, the second ultrasonic unit comprises a second piezoelectric layer, a second circuit pattern layer and a second electrode, the second piezoelectric layer is on the second wafer, the second piezoelectric layer and the first piezoelectric layer are in a same layer and separated from each other, the second circuit pattern layer is covered in the second piezoelectric, the second circuit pattern layer and the first electrode are in a same layer and separated from each other, the second electrode is on the second piezoelectric layer, the first protective layer is provided with a second contact hole, the second contact hole is in communication with the opening, a part of the second conductive circuit is in the second contact hole and is connected to the second electrode, and a part of the conductive material is filled in the second contact hole and is in contact with the second electrode.

4. The wafer scale ultrasonic sensing device according to claim 1, wherein the conductive material is polydimethylsiloxane.

5. A manufacturing method of a wafer scale ultrasonic sensing device, comprising:

a substrate preparation step: providing a first wafer and a composite substrate, wherein the first wafer is provided with a groove, and the composite substrate comprises a second wafer, an insulating layer and a third wafer that are sequentially stacked;

a bonding step: anodic bonding the second wafer with the first wafer, wherein the second wafer covers the groove, so that the groove forms a hollow chamber;

a removing step: removing the insulating layer and the third wafer on the insulating layer to complete a substrate assembly;

an ultrasonic component forming step: forming an ultrasonic component on the second wafer, wherein projections of the ultrasonic component and the hollow chamber are overlapped in a perpendicular direction, and the ultrasonic component comprises a first electrode and a second electrode that is not electrically connected to the first electrode;

a first protective layer forming step: forming a first protective layer on an upper surface of the ultrasonic component and a first surface of the second wafer, wherein the first protective layer is provided with a first contact hole and a second contact hole, and a part of the first electrode and a part of the second electrode are exposed in the first contact hole and the second contact hole respectively;

a circuit connecting step: forming a first conductive circuit and a second conductive circuit on the first protective layer, wherein a part of the first conductive circuit and a part of the second conductive circuit are in the first contact hole and the second contact hole respectively, and are connected to the first electrode and the second electrode of the ultrasonic component respectively;

a second protective layer forming step: forming a second protective layer to cover the first conductive circuit and the second conductive circuit;

an opening forming step: forming an opening on the second protective layer, wherein at least a part of the second electrode is exposed in the opening;

a removing step: removing a part of the substrate assembly, a part of the first protective layer, a part of the first conductive circuit, and a part of the second conductive circuit to form a first side surface on which the first wafer, the second wafer, the first protective layer and the first conductive circuit are coplanar, and a second side surface on which the first wafer, the second wafer, the first protective layer and the second conductive circuit are coplanar;

an electrical connection layer forming step: forming electrical connection layers on the first side surface and the second side surface respectively, wherein the electrical connection layers are connected to the first conductive circuit and the second conductive circuit respectively;

a soldering portion forming step: forming two soldering portions on a surface of the first wafer, wherein the soldering portions are respectively connected to the electrical connection layers; and a conductive material filling step: filling a conductive material in the opening, wherein the conductive material is in contact with the upper surface of the ultrasonic component.

6. The manufacturing method of a wafer scale ultrasonic sensing device according to claim 5, further comprising a grinding step before the bonding step, wherein a thickness of the second wafer is reduced in the grinding step.

7. The manufacturing method of a wafer scale ultrasonic sensing device according to claim 5, further comprising: a carrier plate covering step after the opening forming step, wherein the carrier plate covering step comprises covering a carrier plate on the second protective layer to shield the opening; and a carrier plate removing step after the soldering portion forming step, to remove the carrier plate to expose the opening.

8. The manufacturing method of a wafer scale ultrasonic sensing device according to claim 5, wherein the ultrasonic component forming step comprises:

sequentially forming a first piezoelectric layer, a first electrode, a second piezoelectric layer and a second electrode on the second wafer; and removing a part of the second piezoelectric layer and a part of the second electrode, wherein the second piezoelectric layer and the second electrode do not cover a part of an upper surface of the first electrode, and in the opening forming step, the first protective layer above the second electrode is further removed.

9. The manufacturing method of a wafer scale ultrasonic sensing device according to claim 5, wherein the ultrasonic component forming step comprises:
   sequentially forming a first piezoelectric material layer and a first electrode material layer on the second wafer;
   patterning the first piezoelectric material layer and the first electrode material layer to form a first bottom piezoelectric layer and a second bottom piezoelectric layer that are separated from each other, and a first electrode and a second circuit pattern layer that are stacked on the first bottom piezoelectric layer and the second bottom piezoelectric layer respectively;
   sequentially forming a second piezoelectric material layer and a second electrode material layer on the first electrode and the second circuit pattern layer; and
   patterning the second piezoelectric material layer and the second electrode material layer to form a first piezoelectric layer and a second piezoelectric layer that are separated from each other, and a second electrode that is formed on the second piezoelectric layer, wherein the first electrode is covered in the first piezoelectric layer, and the second circuit pattern layer is covered in the second piezoelectric layer.

10. The manufacturing method of a wafer scale ultrasonic sensing device according to claim 9, wherein the first protective layer forming step further comprises:
   forming a first protective material layer on the first piezoelectric layer, the second piezoelectric layer and the second electrode; and
   punching the first protective material layer to pattern the first protective material layer into the first protective layer, wherein the first protective layer comprises the first contact hole and the second contact hole, the first contact hole penetrates the first protective layer and the first piezoelectric layer so that a part of the first electrode is exposed in the first contact hole, and the second contact hole penetrates the first protective layer so that a part of the second electrode is exposed in the second contact hole.

11. The manufacturing method of a wafer scale ultrasonic sensing device according to claim 5, wherein the bonding step is performed in a vacuum environment.

* * * * *